United States Patent [19]

Moskowitz et al.

[11] Patent Number: 4,925,346
[45] Date of Patent: May 15, 1990

[54] METHOD OF INCREASING USEFUL LIFE OF TOOL STEEL CUTTING TOOLS

[75] Inventors: David Moskowitz, Southfield; David W. Hoffman, Ann Arbor; Duane J. Schmatz, Dearborn Heights, all of Mich.

[73] Assignee: Ford Motor Company, Dearborn, Mich.

[21] Appl. No.: 332,127

[22] Filed: Apr. 3, 1989

Related U.S. Application Data

[62] Division of Ser. No. 135,881, Dec. 21, 1987, Pat. No. 4,820,392.

[51] Int. Cl.⁵ ...................... B23B 35/00; B23B 1/00
[52] U.S. Cl. .................................. 408/1 R; 82/1.11; 407/119; 408/144
[58] Field of Search .................. 408/1 R, 144, 145; 407/119; 82/1.11

[56] References Cited

U.S. PATENT DOCUMENTS 3,160,480 12/1964 Alliegro ........................... 428/472
4,237,184 12/1980 Sonseth et al. .................. 428/469
4,411,960 10/1983 Mizulara ........................... 428/448

FOREIGN PATENT DOCUMENTS 9604 1/1985 Japan ................................. 408/144
2290870 12/1987 Japan ............................... 408/144

*Primary Examiner*—Daniel Howell
*Attorney, Agent, or Firm*—Joseph W. Malleck; Roger L. May

[57] ABSTRACT

The wear life of a high-speed tool steel cutting bit is increased by (a) cleansing the bit by subjection to an ion beam; (b) while preventing the temperature of said cleansed from rising above 350° C., coating the cleansed bit by condensing sputtered atoms of titanium and boron thereonto, the condensation being carried out to provide a coating thickness of 2–6 microns. An argon or krypton beam of ions is accelerated to 1300–1800 volts as a broad-beam ion source to sputter a titanium diboride target arranged as a cathode. The sputtering is carried out for 5–10 minutes while the bit is heated to about 200° C., and a soft vacuum of about 4–6 milli-torr is used during the process.

5 Claims, 1 Drawing Sheet

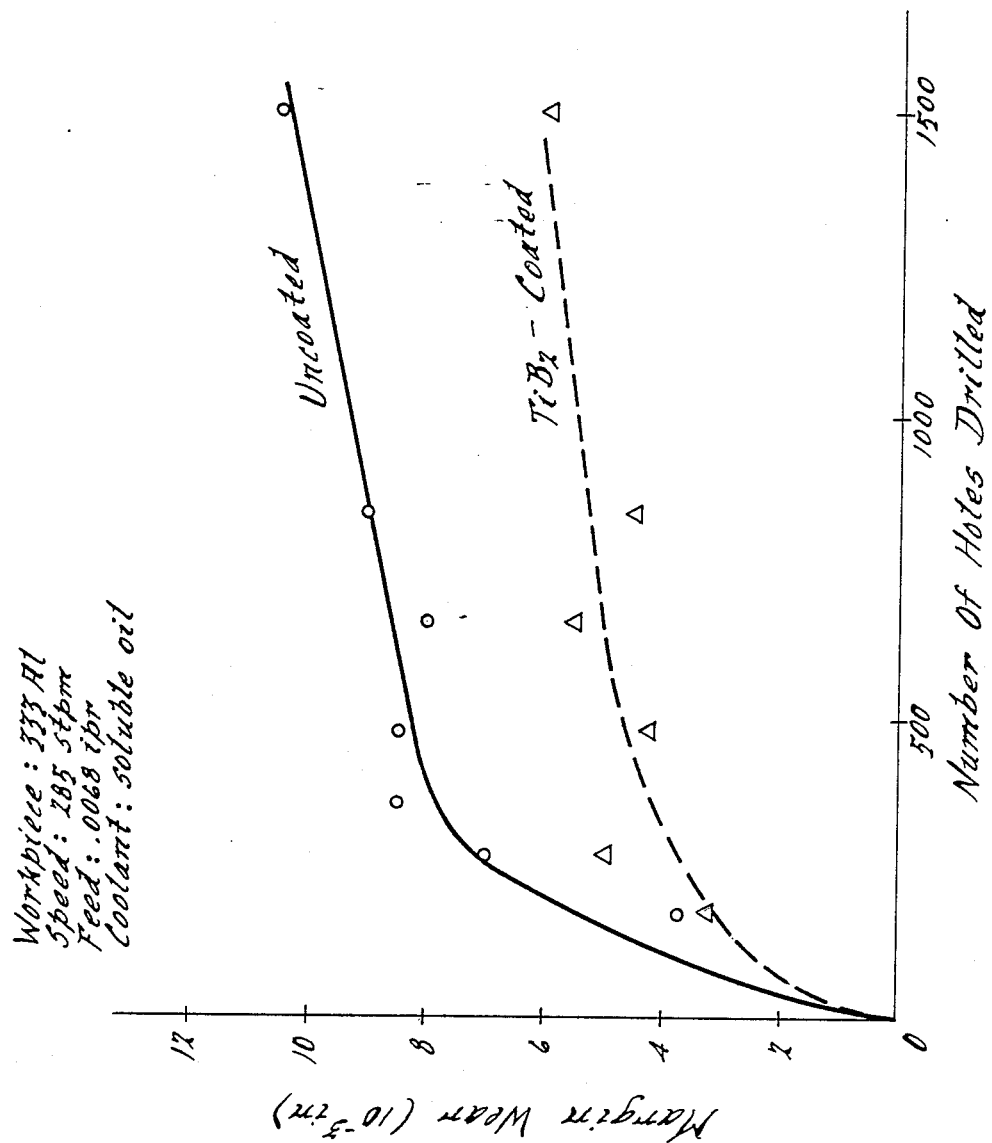

METHOD OF INCREASING USEFUL LIFE OF TOOL STEEL CUTTING TOOLS

This is a Division of application Ser. No. 135,881, filed Dec. 21, 1987, now U.S. Pat. No. 4,820,392.

BACKGROUND OF THE INVENTION

1. Technical Field

This invention relates to the art of making iron-based cutting tools and, particularly, to a coating mechanism that promotes long tool life at high machining speeds.

2. Description of the Prior Art

Various coatings have been employed to increase the tool life of cutting tools made of tool steels. These coatings have principally consisted of carbides and nitrides applied with a variety of techniques. However, such coatings do not exhibit the unusual wear characteristic of titanium diboride. Titanium diboride has an extremely high vickers micro-hardness value, typically about 3600, which is not only considerably higher than other borides but also substantially higher than other carbides or nitrides. Titanium diboride is also particularly noted for its high density, e.g., 88% of theoretical density, a low resistivity of 30 micro-ohms centimeters, a high strength of about 40,000 psi, and a coefficient of thermal expansion which is about $8.1 \times 10^{-6}$ at the temperature range of 20°–800° C.

One of the most troubling problems associated with deployment of titanium diboride on tool steels is that of adhering it thereto. It is known that titanium diboride can be diffused into steel, but this is disadvantageous because it would not obtain the best metal boride for wear resistance. In U.S. Pat. No. 3,029,162, a disclosure was made as to how to first coat a layer of titanium onto a steel substrate and thereafter diffuse the boride into the titanium to obtain a coating of titanium bidoride. Unfortunately, this technique requires multiple layers and is not easily controllable to obtain a desired thickness of titanium diboride and, most importantly, results in a sublayer of pure titanium which is not only expensive but disadvantageous. In another related patent, namely, U.S. Pat. No. 4,411,960, a slurry of molten titanium metal was coated onto a steel substrate and thereafter quenched in a boride salt bath to promote diffusion of the boron into the titanium. For the reasons recited above, this multiple step diffusion process is not desirable.

An attempt was made to secure titanium diboride or similar type compounds to a steel substrate by the use of soldering (see U.S. Pat. No. 3,160,480). A soldering substance, particularly disclosed as being Ni—Fe—Co alloy, was used which, when heated to the temperature range of 1100° C., operated and functioned much as a soldering material to attach the titanium diboride thereto. Unfortunately, this is undesirable because in the use of steel substrates, heating to soldering temperatures may destroy the heat treatment characteristics of steel previously promoted in the material and would require additional reheating to reestablish such characteristics.

Attempts have been made to deposit titanium diboride onto a steel substrate by chemical vapor deposition (see U.S. Pat. No. 4,237,184). The deposition is generally effected at a temperature between about 850°–1200° C. The starting gaseous product is typically two halogenides and hydrogen. Unfortunately, the requirement for such high temperature heating destroys any previous heat treatment that has been promoted in the steel substrate and would require reheating again.

Sputtering is another deposition technique which has been mentioned in connection with a variety of other materials other than titanium diboride. Applicant is unaware of any attempt to apply titanium diboride to steel substrates by sputtering; this may in part be explained by the difficulty in obtaining an ultra-clean surface on steel substrates to receive the condensate of the sputtered material.

Accordingly, a primary object of this invention is to provide a method by which titanium diboride may be deposited in a very adherent manner in a relatively thin coating to achieve a highly wear resistant coating on steel substrates which has its own modulus or rigidity and does not require special preparation or treatment of the substrate after such deposition.

SUMMARY OF THE INVENTION

The first aspect of this invention is a method of increasing the wear life of a high-speed tool steel cutting bit, comprising: (a) cleansing the bit by subjection to an argon ion beam; (b) while preventing the temperature of said cleansed surface from rising above 350° C., coating the cleansed bit by condensing sputtered atoms of titanium and boron thereonto, the condensation being carried out to provide a coating of $TiB_2$ of a preferred thickness of 3–5 microns.

Preferably, an argon or krypton beam of ions is accelerated to 1300–1800 volts as a broad-beam ion source to sputter a titanium diboride target arranged as a cathode. Advantageously, the sputtering is carried out for 5–10 minutes. Preferably, the bit is heated to about 200° C. and a soft vacuum of about 4–6 milli-torr is used during the process.

SUMMARY OF THE DRAWINGS

The FIGURE is a graphical illustration of average margin wear plotted against the number of holes drilled with a drill bit either coated according to this invention or in the uncoated condition.

DETAILED DESCRIPTION AND BEST MODE

High speed steel cutting tool inserts coated with a thin layer of titanium diboride ($TiB_2$) by a dual ion beam sputtering method, show a marked increase in tool life when machining aluminum-based workpieces. High speed tool steels for the inserts typically have designations of the M or T type. Those with an M designation contain tungsten, molybdenum, chromium and vanadium as alloying ingredients and sometimes cobalt. Tungsten will be in the range of 1.5–20% by weight, chromium in the range of 3.75–4.50% by weight, and vanadium in the range of 1–5.0% by weight. Molybdenum, when present, will preferably be in the range of 3.75–9.5%, and cobalt, when present, will be in the range of 5–12%. Carbon for high-speed tool steels is in the range of 0.75–1.25% by weight.

For example, an M-2 type high-speed tool steel, used for examples later herein, contain 0.85% carbon, 6% tungsten, 5% molybdenum, 4% chromium, and 2% vanadium, with no cobalt present. High speed tool steel is characterized not only by the presence of higher percentages of carbide forming elements, but also by the fact that the secondary hardening effects of these elements impart a high resistance to softening at elevated temperatures. These steels require special heat treatment in order that their unique properties may be fully realized. Special heat treatment often may comprise heating to a temperature (2150°-2400° F.) to obtain solution of substantial percentage of the alloy carbides, quenching to room temperature, at which stage a considerable amount of the austenite is retained, tempering at 1000°-1150° F., and again cooling to room temperature. During tempering, alloy carbides are precipitated, resulting in marked secondary hardening and a reduction of alloy content in the retained austenite, which then transforms to martensite on cooling to room temperature and results in a still greater hardness increase. It is often desirable to temper a second time to temper the martensite formed on cooling from the original tempering. This very time consuming and expensive heat treatment process should not be dissipated as a result of the coating technique.

The surface of the tool bit or substrate should be prepared (i.e., by grinding, etc.) with the surface finish in the range of 15 micro-inches or less. This promotes the cleansing and coating technique by sputtering to be explained hereafter.

To coat the high-speed tool steel bits, they are placed in a pressure chamber having ion guns located at opposite ends of the chamber, each effective to project an ion beam into the chamber, along with an electrically grounded TiB$_2$ target material. A moveable plate is placed in such chamber in a position to operate as a cathode and to which the tool bit is in contact for electrical grounding; each gun is arranged to operate as an anode. The tool bit is radiantly heated to a temperature of about 190°-210° C. It is important that the bit not be raised in temperature above 350° C. The chamber is evacuated to $10^{-6}$ Torr pressure, then reduced to a soft vacuum on the order of $10^{-4}$ Torr (in the range of $10^{-4}$ to $10^{-6}$) by the introduction of argon gas. A first of the guns is effective to generate a large argon ion beam of a diameter of about 7-9 inches when an electrical potential difference is maintained between the plate and first gun, such potential being about 1400-1600 volts, preferably about 1500 volts.

The large beam from the first gun is bathed over the electrically grounded tool bit, striking the various rake, flank and end surfaces to preclean such surfaces for a period of 1-3 minutes. The ion beam bombards the bit surfaces (energy range of 1200-1700 electron volts) to remove surface impurity films and, to a certain extent, dislodge poorly adherent metal material. The cleansing process activates the surfaces of the tool bit to be more amenable to tenacious bonding of an overlaying titanium boride coating.

Next, the cleansed and activated substrate is subjected to sputtering. The second of the guns is effective to generate a smaller argon ion beam of a diameter of 0.5-1.5 inches, preferably about one inch. An electrical potential of about 1500 volts is again maintained between the second gun and target. The second gun is aimed at the target to impinge the smaller beam thereon. Atoms of titanium and boron are sputtered or dislodged from the target and intercepted by the electrically grounded tool bit while such bit is still under bombardment by the large ion beam from the first gun. The beam from the second gun is comprised of argon ions accelerated to 1300-1800 electron volts forming a broad-beam ion source. This overlap of beam functions facilitates greater adhesion of the coating to the tool bit substrate. After the titanium and boron have started to condense on the tool bit surfaces to form a deposit of TiB$_2$, usually less than one micrometer in 1-2 minutes, the large ion beam is turned off for the remainder of the sputtering treatment. Sputtering is continued until a deposit of about 2-6 micrometers is obtained, which is relatively thin, but not micro-thin; the period for such deposition is typically about 5-10 minutes. Alternatively, krypton gas may be used to displace the argon gas during sputtering.

Another aspect of this invention is the method of deploying such TiB$_2$ coated tool steel bit at high speeds. It essentially comprises moving an iron-based (greater than 50% Fe by weight) cutting tool against an aluminum-based workpiece at surface speeds exceeding 1000 sfm to continuously cut such workpiece, the tool having cutting surfaces coated with a single-phase crystal film of TiB$_2$. Tool life is dramatically increased.

Yet another aspect of this invention is the novel construction of a cutting tool for machining aluminum-based workpieces at surface speeds equal to or in excess of 1000 sfm and having enhanced wear resistance. The construction comprises (a) a preshaped base of steel having a cutting edge, and (b) a single-phase crystal film of sputtered TiB$_2$ coated onto such edge.

EXAMPLES

M-2 type high-speed tool steel inserts were coated by the disclosed process using a titanium diboride compound target (source of coating material) that was sputtered with a beam of krypton ions accelerated to 1500 volts in a broad beam ion source. The resulting titanium diboride vapor condensed on the steel inserts, which had been heated to about 200° C., and sputter-cleaned using an argon ion beam from another ion source prior to and during the initial stages of deposition. This yielded an adherent coating of TiB$_2$ approximately three microns thick (0.0001") on the flank, rake and end cutting edge faces of the tool insert. Turning tests at 1000 and 2000 sfpm cutting speeds were run on a sodium-modified 333 aluminum alloy workpiece. the cutting depth was 0.040", the feed was 0.007 inches per revolution, and a water-soluble oil emulsion coolant was used in all tests. The machining was carried out with a style SPG-422 insert. The results of these machining tests are shown in Table I, below. Tool life is given as the cutting time in minutes to 0.010" of flank wear.

TABLE I

| TOOL LIFE OF TiB$_2$ - COATED AND UNCOATED M-2 INSERTS MACHINING 333 ALUMINUM ALLOY (Coolant: 5% 589B, Feed: .007 ipr. Depth: .040 in.) | | |
|---|---|---|
| Insert | Cutting Speed (sfpm) | Tool Life (min.) |
| M-2 Coated | 1000 | 479.6 |
| M-2 Uncoated | 1000 | 180.6 |
| M-2 Coated | 2000 | 83.6 |
| M-2 Uncoated | 2000 | 7.3 |

As shown in the Table, the beneficial effect of the titanium diboride coating on increasing tool life is marked. This is especially true at the higher speed of 2000 sfpm, where the coated tool's life was approximately eleven times that of the uncoated one. This is highly significant for high-speed steel tools, which are normally limited to use at relatively low cutting speeds. The ability to use them at higher cutting speeds should allow for the elimination of bottlenecks in manufacturing operations that are limited in speed by the present relatively low speed capability.

Drilling is typical of such bottleneck manufacturing operations, as it is usually done at relatively low speeds. Here, too, the use of a titanium diboride coating proved beneficial. The figure shows the results of drilling tests conducted on 333 aluminum alloy using $TiB_2$ coated versus uncoated M-2 type spiral 2-flute 5/16" diameter drills. Each drill was evaluated by drilling 1500 one inch deep blind holes at 285 surface feet per minute and margin wear on each flute was measured periodically. Note the substantially lower average margin wear of the $TiB_2$ coated drill as compared to the uncoated drill. After 1500 holes, it showed only 57% of the average margin wear of the uncoated drill.

While particular examples of the invention have been illustrated and described, it will be obvious to those skilled in the art that various changes and modifications may be made without departing from the invention, and it is intended to cover in the appended claims all such modifications and equivalents as fall within the true spirit and scope of this invention.

We claim:

1. A method of machining aluminum-based workpieces at high-speeds, comprising:
   moving an iron-based cutting tool against said aluminum-based workpiece at surface speeds exceeding 1000 sfm to continuously cut said workpiece, said tool having cutting surfaces coated with a single-phase crystal film of $TiB_2$.

2. A method of machining aluminum-based workpieces at high speeds, comprising: moving a cutting tool against said aluminum-based workpiece at surface speeds in excess of 1000 sfm to continuously machine the surface thereof, said tool having a cutting surface constituted of a substrate and a coating, the substrate being a steel with precipitated carbides and a martensitic microstructure induced by heat treatment, said coating being a single-phase crystal film of $TiB_2$ adhered to the substrate in a thickness sufficient to impact hardness to the substrate but prevent delamination under machining conditions.

3. The method as in claim 2, in which said coating is 2-6 microns thick and effective to prevent any difference in thermal expansion or resistivity with said substrate from promoting delamination.

4. The method as in claim 2, in which said coating is about 3 microns thick whereby the machining life of said tool is at least 100% greater than an uncoated tool of the same substrate.

5. The method as in claim 3, in which said tool is moved at a surface speed of at least 2000 sfpm to carry out turning machining.

* * * * *